United States Patent
Hayashi et al.

(10) Patent No.: US 10,847,559 B2
(45) Date of Patent: Nov. 24, 2020

(54) SOLID-STATE IMAGE SENSOR AND ELECTRONIC DEVICE

(71) Applicant: SONY SEMICONDUCTOR SOLUTIONS CORPORATION, Kanagawa (JP)

(72) Inventors: Toshihiko Hayashi, Kanagawa (JP); Atsushi Yamamoto, Kanagawa (JP); Hiroshi Tanaka, Nagasaki (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/328,896

(22) PCT Filed: Sep. 28, 2017

(86) PCT No.: PCT/JP2017/035193
§ 371 (c)(1),
(2) Date: Feb. 27, 2019

(87) PCT Pub. No.: WO2018/070262
PCT Pub. Date: Apr. 19, 2018

(65) Prior Publication Data
US 2019/0229136 A1  Jul. 25, 2019

(30) Foreign Application Priority Data
Oct. 12, 2016 (JP) .................. 2016-200645

(51) Int. Cl.
*H01L 27/146* (2006.01)
*G02B 1/115* (2015.01)
(Continued)

(52) U.S. Cl.
CPC .......... *H01L 27/1462* (2013.01); *G02B 1/115* (2013.01); *G02B 3/00* (2013.01);
(Continued)

(58) Field of Classification Search
None
See application file for complete search history.

(56) References Cited

U.S. PATENT DOCUMENTS

| 2002/0074929 A1* | 6/2002 | Taskar ...................... G01T 1/20 313/467 |
| 2007/0097249 A1* | 5/2007 | Korenaga ............ H04N 3/1593 348/335 |

(Continued)

FOREIGN PATENT DOCUMENTS

| CN | 101711676 A | 5/2010 |
| CN | 103069309 A | 4/2013 |

(Continued)

OTHER PUBLICATIONS

International Search Report and Written Opinion of PCT Application No. PCT/JP2017/035193, dated Nov. 14, 2017, 11 pages of ISRWO.

*Primary Examiner* — Benjamin P Sandvik
(74) *Attorney, Agent, or Firm* — Chip Law Group

(57) ABSTRACT

Provided is a solid-state image sensor that includes a micro lens through which incident light is condensed, a photoelectrical conversion unit that generates electric charge based on the condensed incident light, and a translucent plate formed between the micro lens and the photoelectrical conversion unit and including a light-shielding wall provided between a translucent part provided for each pixel and the pixel. An antireflection film including films of two layers or more is formed between the light-shielding wall and the translucent part.

7 Claims, 9 Drawing Sheets

(51) Int. Cl.
*H04N 5/369* (2011.01)
*G06K 9/00* (2006.01)
*G02B 5/00* (2006.01)
*H04N 5/357* (2011.01)
*G02B 3/00* (2006.01)

(52) U.S. Cl.
CPC ............ *G02B 5/00* (2013.01); *G06K 9/00885* (2013.01); *H01L 27/14623* (2013.01); *H01L 27/14627* (2013.01); *H01L 27/14629* (2013.01); *H01L 27/14649* (2013.01); *H01L 27/14685* (2013.01); *H04N 5/3572* (2013.01); *H04N 5/369* (2013.01); *G06K 2009/00932* (2013.01)

(56) References Cited

U.S. PATENT DOCUMENTS

| | | | |
|---|---|---|---|
| 2009/0124038 A1* | 5/2009 | Tuttle | H01L 27/14689 438/70 |
| 2009/0127442 A1* | 5/2009 | Lee | H01L 27/14625 250/227.11 |
| 2010/0080422 A1 | 4/2010 | Sato | |
| 2011/0279727 A1* | 11/2011 | Kusaka | H01L 27/14621 348/340 |
| 2013/0135519 A1 | 5/2013 | Katsuda et al. | |
| 2013/0200251 A1* | 8/2013 | Velichko | H01L 31/18 250/208.1 |
| 2017/0084653 A1 | 3/2017 | Nakata | |

FOREIGN PATENT DOCUMENTS

| | | |
|---|---|---|
| CN | 105378925 A | 3/2016 |
| EP | 2607934 A1 | 6/2013 |
| JP | 2003-209235 A | 7/2003 |
| JP | 2005-072662 A | 3/2005 |
| JP | 2010-086241 A | 4/2010 |
| JP | 2012-042665 A | 3/2012 |
| JP | 2012-154825 A | 8/2012 |
| JP | 2015-233043 A | 12/2015 |
| WO | 2012/023372 A1 | 2/2012 |
| WO | 2015/190290 A1 | 12/2015 |

* cited by examiner

20

SOLID-STATE IMAGE SENSOR AND ELECTRONIC DEVICE

CROSS REFERENCE TO RELATED APPLICATIONS

This application is a U.S. National Phase of International Patent Application No. PCT/JP2017/035193 filed on Sep. 28, 2017, which claims priority benefit of Japanese Patent Application No. JP 2016-200645 filed in the Japan Patent Office on Oct. 12, 2016. Each of the above-referenced applications is hereby incorporated herein by reference in its entirety.

TECHNICAL FIELD

The present technology relates to a solid-state image sensor and an electronic device, and particularly relates to a solid-state image sensor and an electronic device that are capable of reducing generation of a ghost image generated by receiving reflected light of incident light that should be received by adjacent pixels.

BACKGROUND ART

Conventionally, as a problem occurring in a solid-state image sensor, crosstalk has been known in which incident light condensed through a micro lens is detected by a photodiode (PD) of an adjacent pixel. Then, a configuration in which a translucent plate is provided between the micro lens and the PD has been proposed as a structure for preventing the crosstalk (for example, refer to Patent Document 1).

FIG. 1 is a cross-sectional view illustrating an exemplary configuration of a conventional solid-state image sensor in which a translucent plate is provided between a micro lens and a PD.

This solid-state image sensor 10 includes, sequentially from the light incident side, a micro lens array 11, a translucent plate 12, a transparent insulating layer 15, and a PD layer 16. The translucent plate 12 includes a translucent part 13 that transmits incident light condensed through the micro lens array 11 for each pixel, and a light-shielding wall 14 that prevents light incident on the translucent part 13 from entering adjacent pixels.

According to the solid-state image sensor 10, since the translucent plate 12 is provided, crosstalk that would occur under the micro lens array 11 can be suppressed.

However, since the translucent plate 12 is provided, incident light G from outside of the viewing angle of the micro lens of the pixel is reflected by the wall surface of the light-shielding wall 14 and incident on the PD layer 16 of the pixel in some cases. In such a case, a ghost image is generated. The generation of the ghost image can be prevented by increasing the distance between pixels.

FIG. 2 is a cross-sectional view illustrating an exemplary configuration of a conventional solid-state image sensor in which the distance between pixels is increased to prevent ghost image generation.

CITATION LIST

Patent Document

Patent Document 1: Japanese Patent Application Laid-open No. 2005-72662

SUMMARY OF THE INVENTION

Problems to be Solved by the Invention

The solid-state image sensor 20 illustrated in FIG. 2 can prevent ghost image generation as compared to the solid-state image sensor 10. However, when the distance between pixels is increased, the area efficiency of the solid-state image sensor is lowered. As a result, the area of the entire solid-state image sensor needs to be increased to obtain desired performance and functions (resolution, the number of pixels, and the like), which leads to cost increase.

The present technology is made in view of such a situation, and is intended to achieve prevention of ghost image generation without reduction in the area efficiency of a solid-state image sensor.

Solutions to Problems

A solid-state image sensor according to a first aspect of the present technology includes: a micro lens through which incident light is condensed; a photoelectrical conversion unit configured to generate electric charge in accordance with the condensed incident light; and a translucent plate formed between the micro lens and the photoelectrical conversion unit and including a light-shielding wall provided between a translucent part provided for each pixel and the pixel. An antireflection film including films of two layers or more is formed between the light-shielding wall and the translucent part.

The antireflection film may prevent reflection of incident light having a particular wavelength.

The light-shielding wall of the translucent plate may include Si.

The antireflection film may include a $TiO_2$ film and an $SiO_2$ film sequentially from the light-shielding wall side.

The antireflection film may include an $HfO_2$ film, an $SiO_2$ film, an Si film, and an $HfO_2$ film sequentially from the light-shielding wall side.

The antireflection film may be formed by an ALD method or a thermal CVD method.

The solid-state image sensor according to the first aspect of the present technology may further include a transparent insulating layer between the translucent plate and the photoelectrical conversion unit. A relation of expressions below holds, and tan θ1>tan θ2 holds:

$$\tan \theta 1 = (X+Y)/B$$

$$\tan \theta 2 = (X-Z)/(A-B)$$

in a case where X represents the radius of the translucent part of the translucent plate, Y represents the radius of the micro lens, Z represents the radius of the photoelectrical conversion unit per pixel, A represents the distance between a lower end of the micro lens and the photoelectrical conversion unit, B represents the thickness of the translucent plate, and C represents the thickness of the transparent insulating layer, and θ1 represents the maximum value of an incident angle of light that is incident from outside the visual field of the micro lens and to be reflected at the light-shielding wall, and θ2 represents the minimum value of an incident angle (reflection angle) at which reflected light of the incident light at the light-shielding wall is to be incident on an edge of the effective radius of the photoelectrical conversion unit.

The incident light having the particular wavelength may be near-infrared light having a central wavelength of 900 nm, the solid-state image sensor is used in a vein authentication device.

An electronic device according to a second aspect of the present technology is an electronic device on which a solid-state image sensor is mounted. The solid-state image sensor includes: a micro lens through which incident light is condensed; a photoelectrical conversion unit configured to generate electric charge in accordance with the condensed incident light; and a translucent plate formed between the micro lens and the photoelectrical conversion unit and including a light-shielding wall provided between a translucent part provided for each pixel and the pixel. An antireflection film including films of two layers or more is formed between the light-shielding wall and the translucent part.

Effects of the Invention

According to the first and second aspects of the present technology, reflection of incident light at a light-shielding wall surface of a translucent plate is reduced, and thus it is possible to reduce generation of a ghost image.

MODE FOR CARRYING OUT THE INVENTION

Hereinafter, best modes (hereinafter, referred to as embodiments) for carrying out the present technology will be described in detail with reference to the drawings.

<Exemplary Configuration of Solid-State Image Sensor According to Embodiment of Present Technology>

Figure 1:
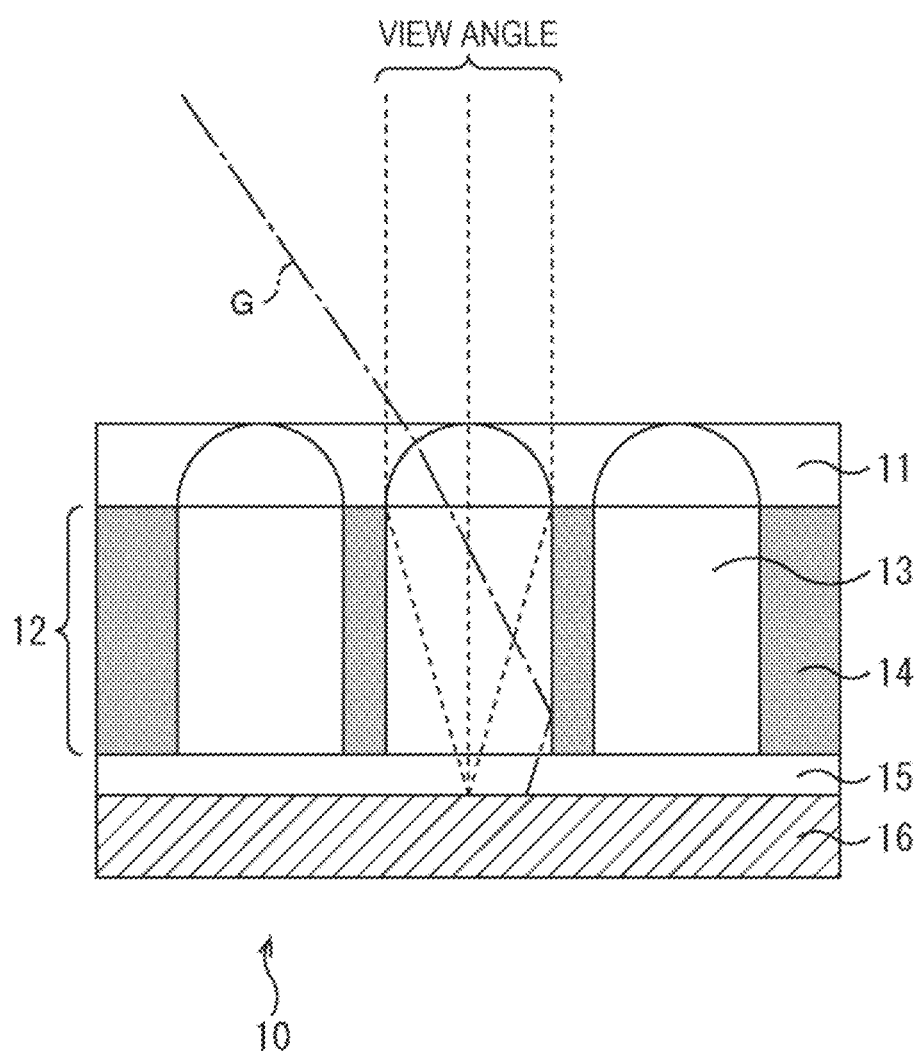
FIG. 1 is a cross-sectional view illustrating an exemplary configuration of a conventional solid-state image sensor in which a translucent plate is provided between a micro lens and a PD.
Figure 2:
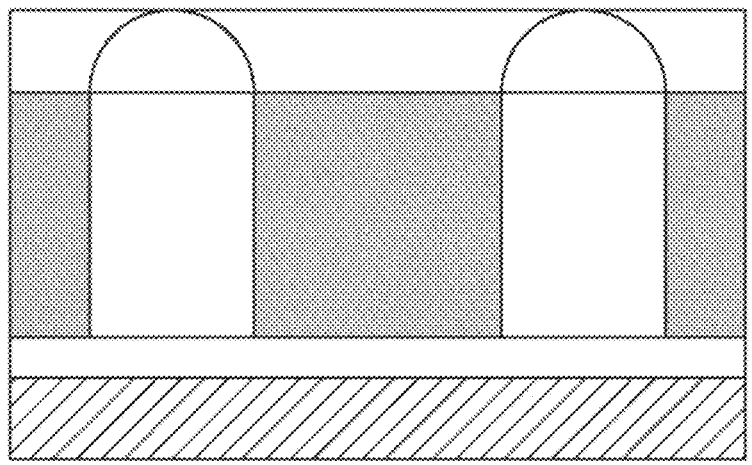
FIG. 2 is a cross-sectional view illustrating an exemplary configuration of a conventional solid-state image sensor in which the distance between pixels is increased.
Figure 3:
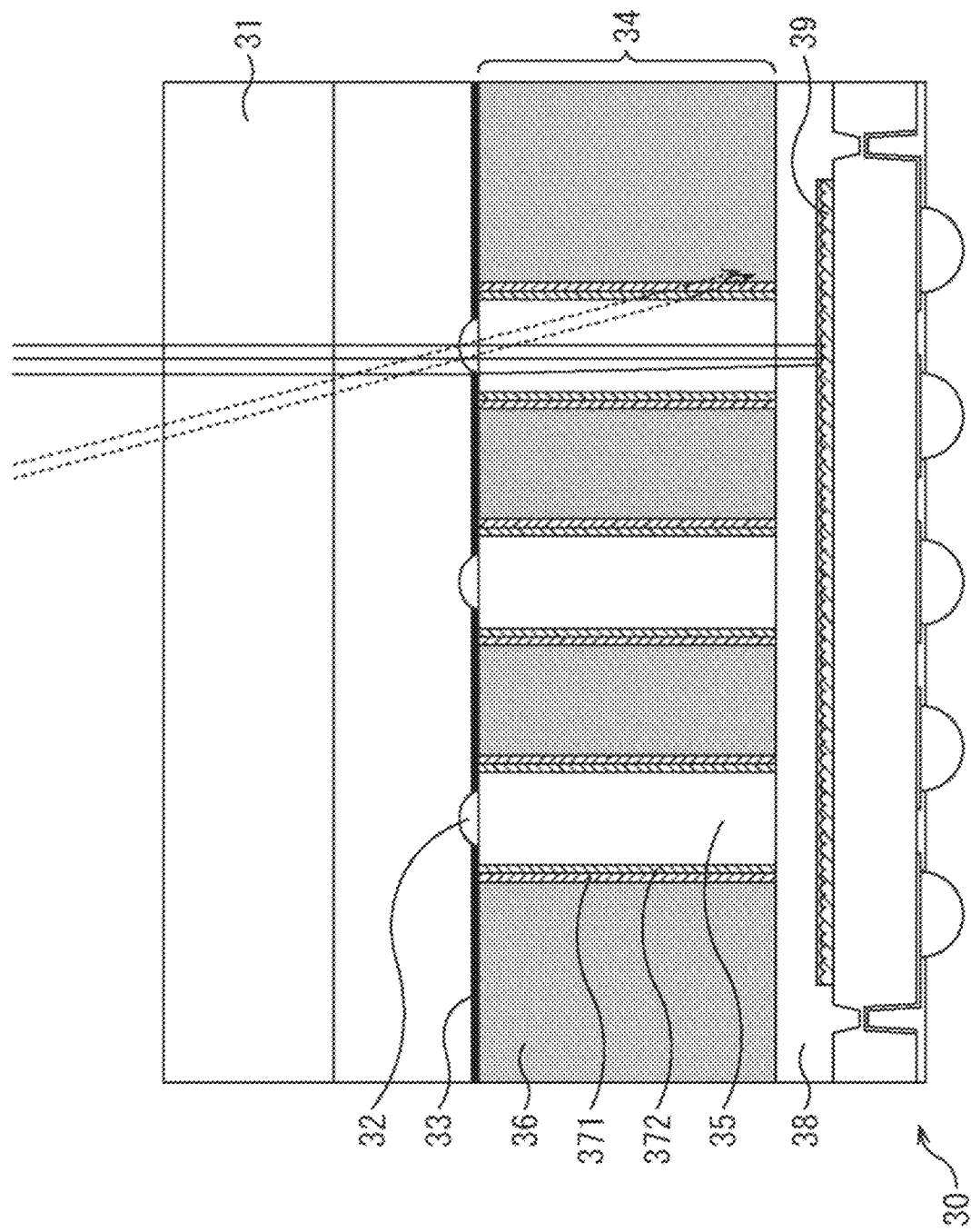
FIG. 3 is a cross-sectional view illustrating an exemplary configuration of a solid-state image sensor to which the present technology is applied.
Figure 4C:
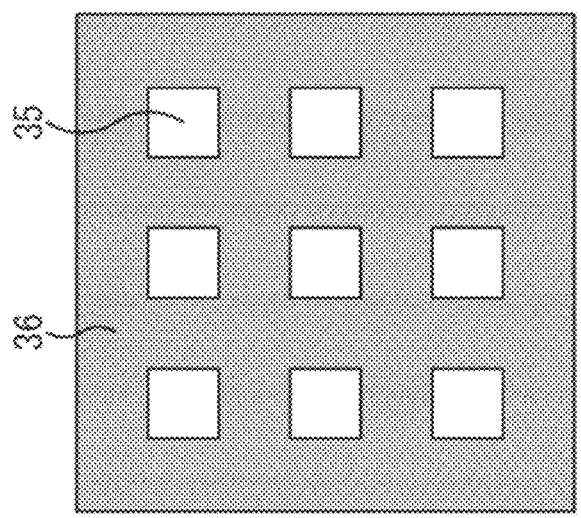
FIGS. 4A, 4B, and 4C are plan views of components of the solid-state image sensor in FIG. 3.
Figure 4B:
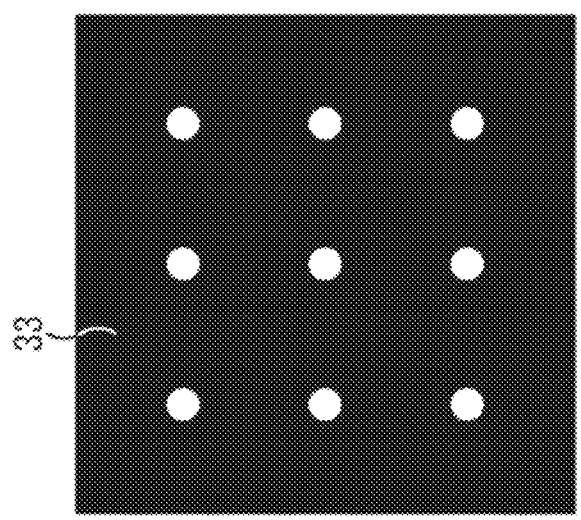
Figure 4A:
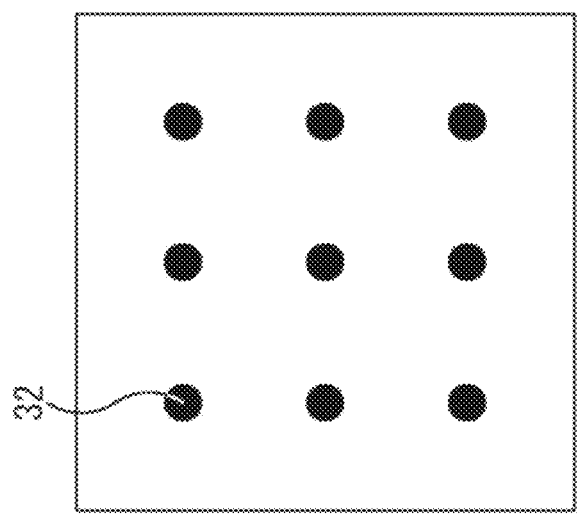

FIG. 3 is a cross-sectional view illustrating an exemplary configuration of a solid-state image sensor according to an embodiment of the present technology. FIGS. 4A, 4B, and 4C illustrate a plan view of components of the solid-state image sensor.

This solid-state image sensor 30 includes, sequentially from the light incident side, a cover glass 31, a micro lens array 32, a front light-shielding body 33, a translucent plate 34, a transparent insulating layer 38, and a PD layer 39.

As illustrated in FIG. 4A, the micro lens array 32 includes a circular micro lens at the position of each pixel.

As illustrated in FIG. 4B, the front light-shielding body 33 shields a region other than the micro lens of each pixel, and is formed to prevent incident light from transmitting into a substrate through the region.

The translucent plate 34 includes a translucent part 35 that transmits incident light condensed through the micro lens array 32 for each pixel, and a light-shielding wall 36 that prevents light incident on the translucent part 35 from entering adjacent pixels as illustrated in FIG. 4C.

In addition, an antireflection film 37 as a stack of two or more layers of predetermined material is formed on a wall surface of the light-shielding wall 36 to prevent incident light from outside of the view angle of the micro lens of the pixel from reflecting at the wall surface.

In the case of FIG. 3, the antireflection film 37 includes, sequentially from a side close to the light-shielding wall 36, two layers of an antireflection-film first layer 371 and an antireflection-film second layer 372. For example, the material of the antireflection-film first layer 371 may be $TiO_2$, and the material of the antireflection-film second layer 372 may be $SiO_2$.

Furthermore, for example, in a case where the antireflection film 37 includes four layers, the materials of the four layers may be, sequentially from the side close to the light-shielding wall 36, $HfO_2$, $SiO_2$, $Si$, and $HfO_2$.

In the solid-state image sensor 30, incident light condensed through the micro lens array 32 is received by the PD layer 39 through the translucent part 35 of the translucent plate 34. Note that incident light from outside of the visual field of the micro lens of each pixel is incident on the wall surface (light-shielding wall 36) inside the translucent plate 34, but is prevented from reflecting and reaching the PD layer 39 by the antireflection-film first layer 371 and the antireflection-film second layer 372. Accordingly, it is possible to prevent ghost image generation.

<Film Thickness of Antireflection Film 37>

Here, the following describes the antireflection film 37 formed on the wall surface of the light-shielding wall 36.

The film thickness of the antireflection film 37 formed on the wall surface of the light-shielding wall 36 is determined in accordance with the incident angle of light from outside of the visual field of the micro lens and a light wavelength to be reduced.

Figure 5:
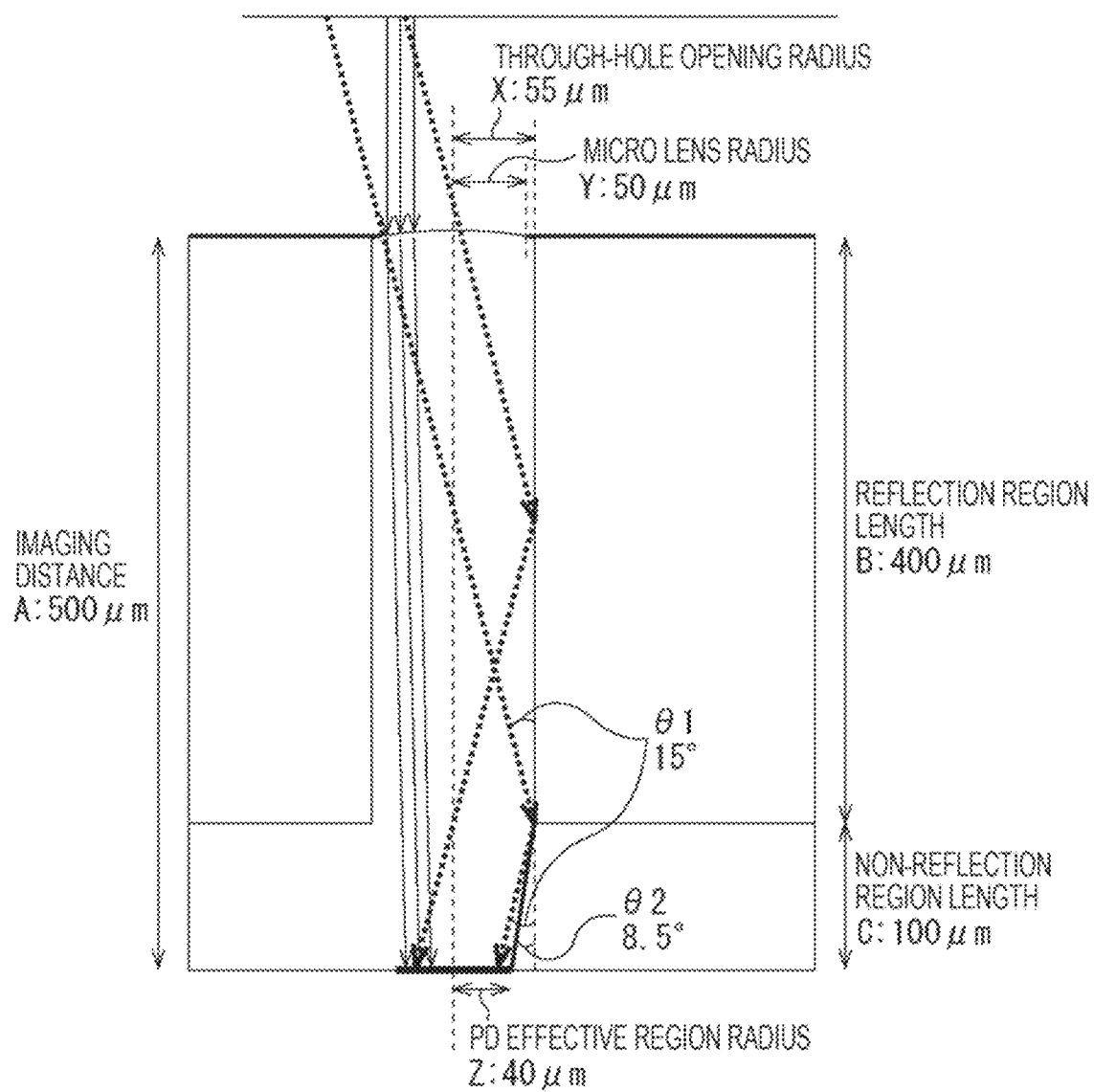
FIG. 5 is a diagram illustrating the relation between the size of each component of a solid-state image sensor and the incident angle of light.

FIG. 5 illustrates the relation between the size of each component of the solid-state image sensor 30 and the incident angle of light from outside of the visual field of the micro lens.

As illustrated in FIG. 5, X represents the radius (through-hole opening radius) of the translucent part 35 of the translucent plate 34, Y represents the radius of the micro lens, Z represents the radius of a PD effective region per pixel, A represents the distance (imaging distance) between a lower end of the micro lens and the PD layer 39, B represents the thickness (reflection region length) of the translucent plate 34, and C represents the thickness (non-reflection region length) of the transparent insulating layer 38. Furthermore, in a case where $\theta 1$ represents the maximum value of the incident angle of light from outside of the visual field of the micro lens to be reflected at the light-shielding wall 36, and $\theta 2$ represents the minimum value of an incident angle (=reflection angle) at which reflected light of the incident light at the light-shielding wall 36 is to be incident on the edge of the PD effective radius, the relation of Expression (1) below holds, and the present technology becomes effective when tan θ1>tan θ2 holds.

$$\tan \theta 1 = (X+Y)/B$$

$$\tan \theta 2 = (X-Z)/(A-B) \quad (1)$$

For example, in a case where X=55 μm, Y=50 μm, Z=40 μm, A=500 μm, B=400 μm, and C=100 μm, the maximum value θ1 of the incident angle is 15°, and the minimum value θ2 of the incident angle (=reflection angle) is 8.5°. This means that, in a case where the incident angle is equal to or larger than 15° and in a case where the incident angle is equal to or smaller than 8.5°, incident light reflects at the wall surface of the light-shielding wall 36 but does not reach the PD effective radius or attenuates through multiple reflection.

Thus, the film thickness of the antireflection film 37 needs to be determined for the incident angle of light from outside of the visual field of the micro lens in the range of 8.5° to 15°.

The wavelength of incident light is normally in the range of 380 nm to 830 nm approximately for visible light. Furthermore, in a case where the solid-state image sensor 30 is used to detect light having a particular wavelength, for example, used for a vein authentication device or the like using light in a near-infrared region (central wavelength of 900 nm), such a wavelength needs to be considered. The following description assumes that the solid-state image sensor 30 is used for a vein authentication device or the like using light in a near-infrared region (central wavelength of 900 nm).

<Relation Between Incident Light Wavelength and Reflectance at Wall Surface of Light-Shielding Wall 36>

Figure 6:
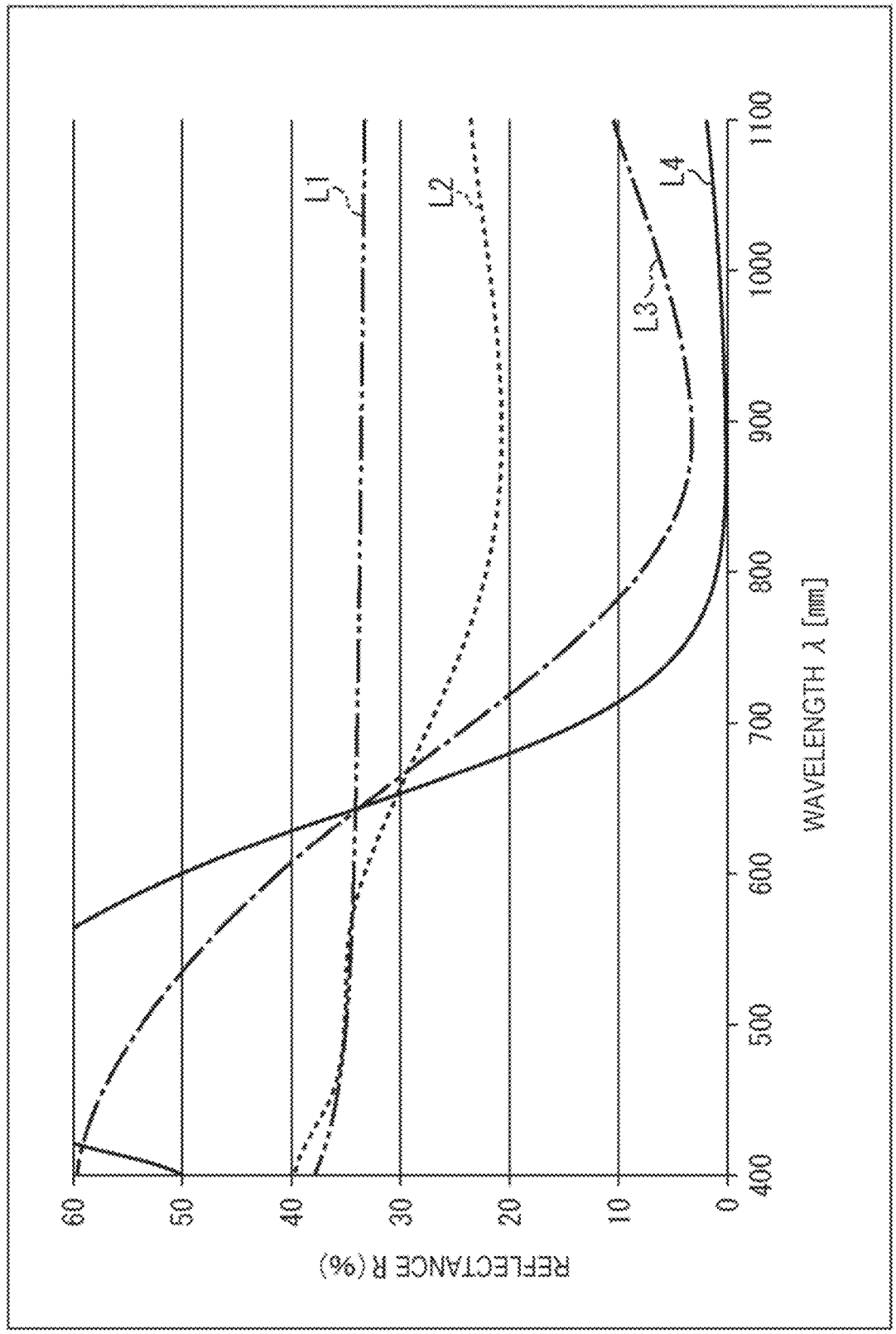
FIG. 6 is a graph illustrating the relation between the wavelength and reflectance of incident light.

Next, FIG. 6 illustrates the relation between the wavelength of incident light and the reflectance at the wall surface of the light-shielding wall 36 for each stacked number of an antireflection film 27.

In the drawing, the horizontal axis represents the wavelength of incident light, and the vertical axis represents the reflectance. Curved line L1 corresponds to a case where no antireflection film 27 is formed. Curved line L2 corresponds to a case where the antireflection film 27 includes a material ($TiO_2$ (121.55 nm)) of a single layer. Curved line L3 corresponds to a case where the antireflection film 27 includes materials ($SiO_2$ (114.99 nm) and $TiO_2$ (39.62 nm), sequentially from the light-shielding wall 36 side) of two layers. Curved line L4 corresponds to a case where the antireflection film 27 includes materials ($HfO_2$ (53.71 nm), Si (24.20 nm), $SiO_2$ (204.27 nm), and $HfO_2$ (45.20 nm), sequentially from the light-shielding wall 36 side) of four layers.

It is shown that, in particular, the reflectance on Curved lines L3 and L4 is low near a wavelength of 900 nm on the horizontal axis in the drawing. In other words, it is shown that, in a case where the antireflection film 27 includes two or more layers, it is possible to sufficiently prevent reflection of incident light near a wavelength of 900 nm at the wall surface of the light-shielding wall 36.

Figure 7:
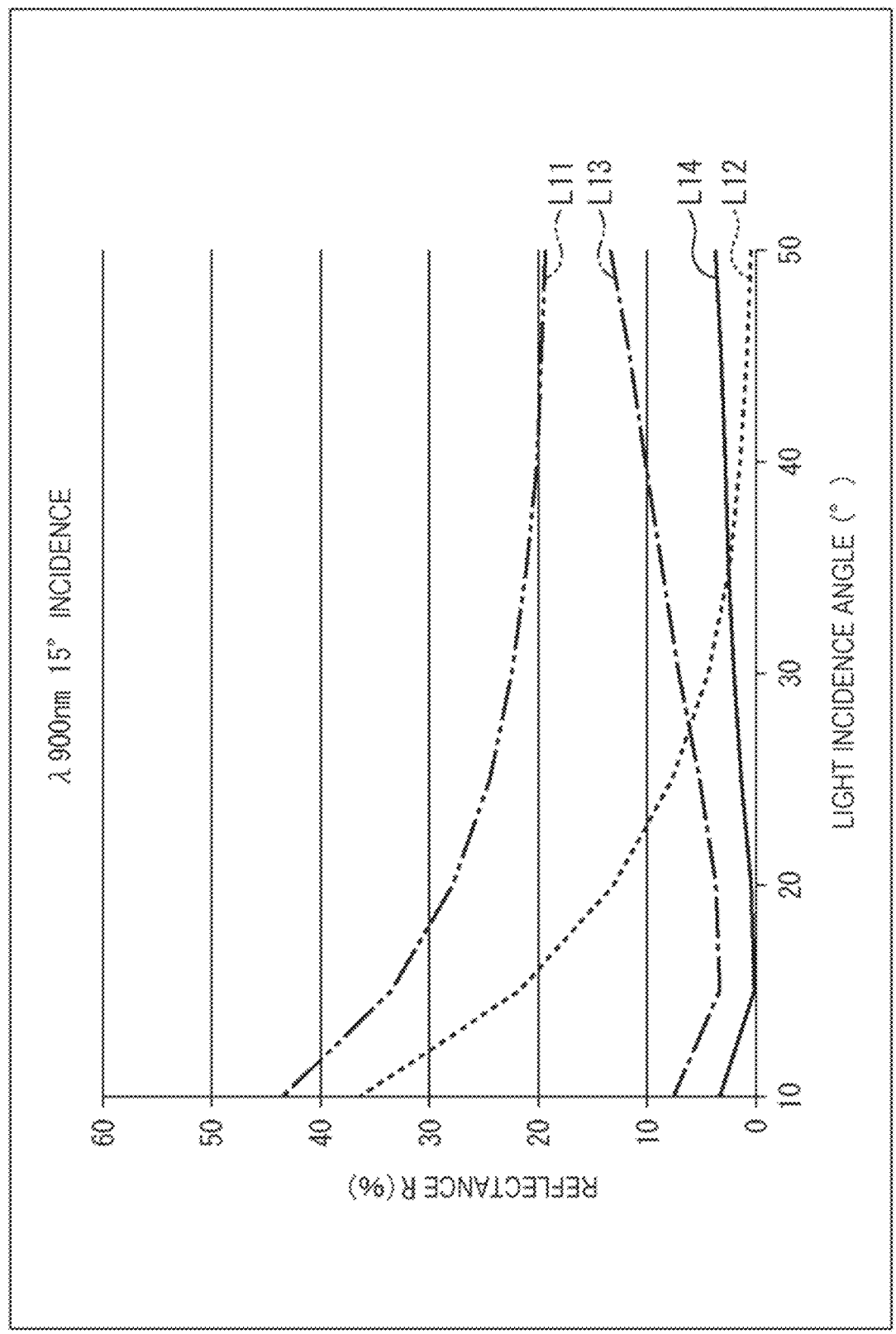
FIG. 7 is a graph illustrating the relation between the incident angle and reflectance of incident light.
Figure 8:
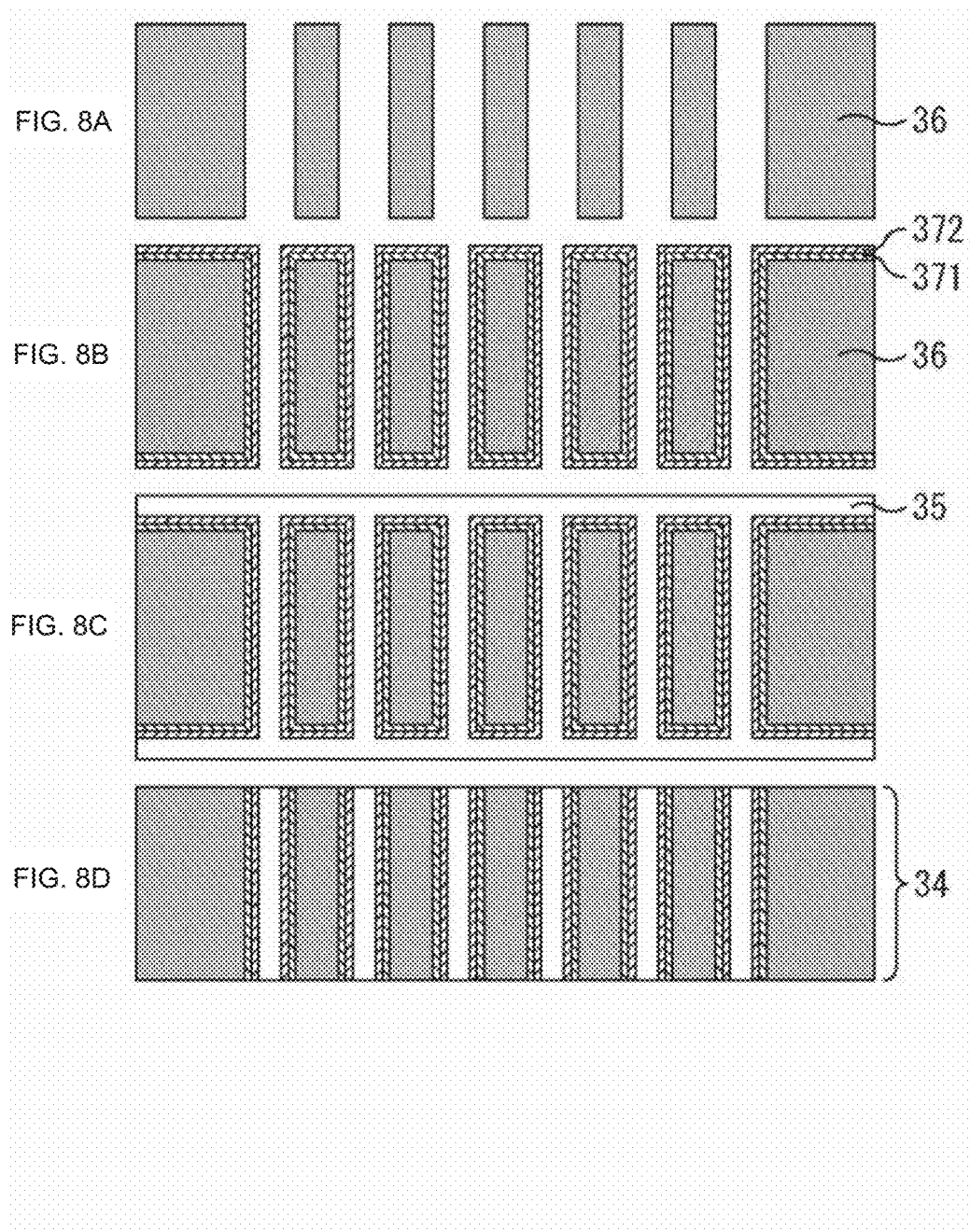
FIGS. 8A, 8B, 8C, and 8D are diagrams for description of a method of manufacturing a translucent plate of a solid-state image sensor.

FIG. 7 illustrates the relation between the incident angle of incident light having a wavelength of 900 nm and the reflectance at the wall surface of the light-shielding wall 36 for each stacking number of the antireflection film 27.

In the drawing, the horizontal axis represents the incident angle of incident light, and the vertical axis represents the reflectance. Curved line L11 corresponds to a case where no antireflection film 27 is formed. Curved line L12 corresponds to a case where the antireflection film 27 includes a material ($TiO_2$ (121.55 nm)) of a single layer. Curved line L13 corresponds to a case where the antireflection film 27 includes materials ($SiO_2$ (114.99 nm) and $TiO_2$ (39.62 nm), sequentially from the light-shielding wall 36 side) of two layers. Curved line L14 corresponds to a case where the antireflection film 27 includes materials ($HfO_2$ (53.71 nm), Si (24.20 nm), $SiO_2$ (204.27 nm), and $HfO_2$ (45.20 nm), sequentially from the light-shielding wall 36 side) of four layers.

It is shown that, in particular, the reflectance on Curved lines L13 and L14 is low near incident angle 15° on the horizontal axis in the drawing. In other words, it is shown that, in a case where the antireflection film 27 includes two or more layers, it is possible to sufficiently prevent reflection of incident light having an incident angle of 15° at the wall surface of the light-shielding wall 36.

<Manufacturing Method>

Next, FIGS. 8A, 8B, 8C, and 8D illustrate a method of manufacturing the translucent plate 34 included in the image sensor 30.

First, as illustrated in A of the drawing, the light-shielding wall 36 is formed by opening a through-hole in a substrate of a light-shielding material such as Si. Subsequently, as illustrated in B of the drawing, the antireflection-film first layer 371 is formed on the surface of the light-shielding wall 36, and the antireflection-film second layer 372 is formed on the antireflection-film first layer 371.

The formation of the antireflection-film first layer 371 and the antireflection-film second layer 372 may employ an ALD method or a thermal CVD method in accordance with the material. For example, the ALD method is employed in a case where the material is $TiO_2$, $SiO_2$, or $HfO_2$. Furthermore, for example, the ALD method is employed in a case where the material is Si or $SiO_2$.

The ALD method and the thermal CVD method have superior step coverage properties to general application method and vapor deposition method, and can form a thin film on side wall surfaces with excellent controllability, so that it is possible to uniformly form the antireflection film 37. As a result, image capturing performance with stable ghost image reduction can be obtained.

Subsequently, as illustrated in C of the drawing, high pressure glass to be the translucent part 35 is encapsulated in the through-hole in which the antireflection-film first layer 371 and the antireflection-film second layer 372 are formed, and thereafter, as illustrated in D of the drawing, the high pressure glass protruding above and below the through-hole is polished to form the translucent plate 34.

The front light-shielding body 33 and the micro lens array 32 are formed on one surface of the translucent plate 34 formed as described above, and the PD layer 39 is stacked on the other surface through the transparent insulating layer 38, thereby forming the solid-state image sensor 30.

<Summary>

In the solid-state image sensor 30 according to the present embodiment, since the translucent plate 34 includes the antireflection film 37 including two or more layers, light having a particular wavelength is prevented from reflecting at a side wall of the translucent plate 34. Furthermore, since the ALD method or the thermal CVD method is employed to form the antireflection film 37 including two or more layers, the thin and uniform antireflection film 37 can be formed, thereby achieving stable antireflection performance. Accordingly, ghost image generation is reduced even when the interval between pixels is narrowed, which leads to increase in the area efficiency of the solid-state image sensor 30.

<Use Example of Solid-State Image Sensor>

Figure 9:
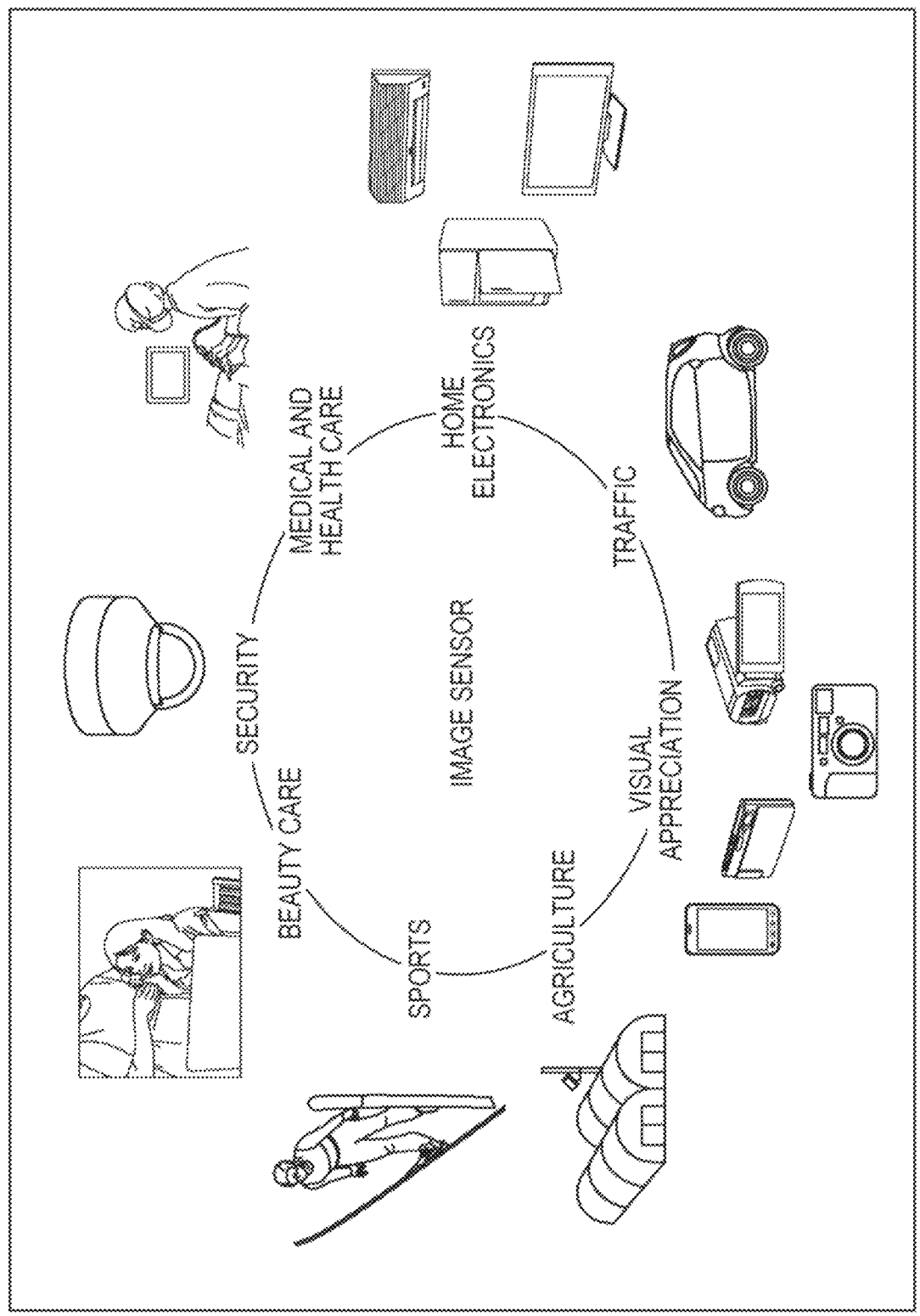
FIG. 9 is a diagram illustrating use examples of an electronic device to which the present technology is applied.

FIG. 9 is a diagram illustrating a use example in which the above-described solid-state image sensor is used.

The above-described solid-state image sensor can be used in, for example, various electronic devices configured to sense light such as visible light, infrared light, ultraviolet light, or X-ray, as described below.

Devices, such as a digital camera and a portable instrument having a camera function, configured to capture images for visual appreciation.

Traffic devices such as an on-board sensor configured to perform image capturing of the front and rear sides, circumference, inside, and the like of an automobile for safety driving such as automatic stopping and recognition of a driver state and the like, a monitoring camera configured to monitor a travelling vehicle or roads, and a distance measurement sensor configured to perform measurement of, for example, the distance between vehicles.

Devices provided to home electronics such as a TV, a refrigerator, and an air conditioner, configured to capture an image of a user gesture to perform an instrument operation in accordance with the gesture.

Medical and healthcare devices such as an endoscope, and a device configured to perform blood vessel image capturing by receiving infrared light.

Security devices such as an anti-crime monitoring camera and a personal authentication camera.

Beauty care devices such as a skin measurement device configured to capture an image of skin and a micro scope configured to capture an image of scalp.

Sport devices such as an action camera and a wearable camera for sport usage and the like.

Agricultural devices such as a camera for monitoring the states of fields and crops.

It is to be noted that the embodiments of the present technology are not limited to the above-described embodiments, and various modifications are possible without departing from the gist of the present technology.

The present technology may be configured as described below.

(1)

A solid-state image sensor including:

a micro lens through which incident light is condensed;

a photoelectrical conversion unit configured to generate electric charge in accordance with the condensed incident light; and a translucent plate formed between the micro lens and the photoelectrical conversion unit and including a light-shielding wall provided between a translucent part provided for each pixel and the pixel, in which an antireflection film including films of two layers or more is formed between the light-shielding wall and the translucent part.

(2)

The solid-state image sensor according to (1), in which the antireflection film prevents reflection of incident light having a particular wavelength.

(3)

The solid-state image sensor according to (1) or (2), in which the light-shielding wall of the translucent plate includes Si.

(4)

The solid-state image sensor according to any one of (1) to (3), in which the antireflection film includes a $TiO_2$ film and an $SiO_2$ film sequentially from the light-shielding wall side.

(5)

The solid-state image sensor according to any one of (1) to (3), in which the antireflection film includes an $HfO_2$ film, an $SiO_2$ film, an Si film, and an $HfO_2$ film sequentially from the light-shielding wall side.

(6)

The solid-state image sensor according to any one of (1) to (5), in which the antireflection film is formed by an ALD method or a thermal CVD method.

(7)

The solid-state image sensor according to any one of (1) to (6), further including a transparent insulating layer between the translucent plate and the photoelectrical conversion unit, in which a relation of expressions below holds, and $\tan\theta_1 > \tan\theta_2$ holds:

$$\tan\theta_1 = (X+Y)/B$$

$$\tan\theta_2 = (X-Z)/(A-B)$$

in a case where X represents the radius of the translucent part of the translucent plate, Y represents the radius of the micro lens, Z represents the radius of the photoelectrical conversion unit per pixel, A represents the distance between a lower end of the micro lens and the photoelectrical conversion unit, B represents the thickness of the translucent plate, and C represents the thickness of the transparent insulating layer, and $\theta_1$ represents the maximum value of an incident angle of light that is incident from outside the visual field of the micro lens and to be reflected at the light-shielding wall, and $\theta_2$ represents the minimum value of an incident angle (reflection angle) at which reflected light of the incident light at the light-shielding wall is to be incident on an edge of the effective radius of the photoelectrical conversion unit.

(8)

The solid-state image sensor according to any one of (2) to (7), in which the incident light having the particular wavelength is near-infrared light having a central wavelength of 900 nm, and the solid-state image sensor is used in a vein authentication device.

(9)

An electronic device on which a solid-state image sensor is mounted, in which the solid-state image sensor includes:

a micro lens through which incident light is condensed;

a photoelectrical conversion unit configured to generate electric charge in accordance with the condensed incident light; and a translucent plate formed between the micro lens and the photoelectrical conversion unit and including a light-shielding wall provided between a translucent part provided for each pixel and the pixel, and an antireflection film including films of two layers or more is formed between the light-shielding wall and the translucent part.

REFERENCE SIGNS LIST

30 Solid-state image sensor
31 Cover glass
32 Micro lens array
33 Front light-shielding body
34 Translucent plate
35 Translucent part
36 Light-shielding wall
37 Antireflection film 371 Antireflection-film first layer
372 Antireflection-film second layer

The invention claimed is:

1. A solid-state image sensor, comprising:
a micro lens configured to condense incident light;
a photoelectrical conversion unit configured to generate electric charge based on the condensed incident light;
a translucent plate between the micro lens and the photoelectrical conversion unit, wherein
the translucent plate includes a light-shielding wall, a first translucent part, and a second translucent part,
the first translucent part corresponds to a first pixel,
the second translucent part corresponds to a second pixel,
each of the first pixel and the second pixel is associated with the solid-state image sensor, and
the light-shielding wall is between the first translucent part and the second translucent part; and
an antireflection film between the light-shielding wall and the first translucent part, wherein
the antireflection film is configured to prevent reflection of the condensed incident light having a particular wavelength,
the antireflection film includes a first antireflection film layer, a second antireflection film layer, a third antireflection film layer, and a fourth antireflection film layer,
the first antireflection film layer and the fourth antireflection film layer include $HfO_2$,
the second antireflection film layer includes $SiO_2$,
the third antireflection film layer includes Si, and
the first antireflection film layer, the second antireflection film layer, the third antireflection film layer, and the fourth antireflection film layer are in this order from the light-shielding wall.

2. The solid-state image sensor according to claim 1, wherein the light-shielding wall includes Si.

3. The solid-state image sensor according to claim 1, wherein the antireflection film is formed by one of an ALD method or a thermal CVD method.

4. The solid-state image sensor according to claim 1, further comprising a transparent insulating layer between the translucent plate and the photoelectrical conversion unit, wherein
a relation of expressions below holds, and $\tan \theta_1 > \tan \theta_2$ holds:

$$\tan \theta_1 = (X+Y)/B,$$

$$\tan \theta_2 = (X-Z)/(A-B),$$

where X represents a radius of the first translucent part of the translucent plate, Y represents a radius of the micro lens, Z represents a radius of the photoelectrical conversion unit per pixel, A represents a distance between a lower end of the micro lens and the photoelectrical conversion unit, B represents a thickness of the translucent plate, and C represents a thickness of the transparent insulating layer,
$\theta_1$ represents a maximum value of a first incident angle of the condensed incident light that is incident from outside a visual field of the micro lens and reflected at the light-shielding wall, and
$\theta_2$ represents a minimum value of a second incident angle at which reflected light of the condensed incident light at the light-shielding wall is incident on an edge of an effective radius of the photoelectrical conversion unit.

5. The solid-state image sensor according to claim 1, wherein
the condensed incident light is near-infrared light,
the near-infrared light has a central wavelength of 900 nm, and
the solid-state image sensor is in a vein authentication device.

6. An electronic device, comprising:
a solid-state image sensor that includes:
a micro lens configured to condense incident light;
a photoelectrical conversion unit configured to generate electric charge based on the condensed incident light;
a translucent plate between the micro lens and the photoelectrical conversion unit, wherein
the translucent plate includes a light-shielding wall, a first translucent part, and a second translucent part,
the first translucent part corresponds to a first pixel,
the second translucent part corresponds to a second pixel,
each of the first pixel and the second pixel is associated with the solid-state image sensor, and
the light-shielding wall is between the first translucent part and the second translucent part; and
an antireflection film between the light-shielding wall and the first translucent part, wherein
the antireflection film is configured to prevent reflection of the condensed incident light having a particular wavelength,
the antireflection film includes a first antireflection film layer, a second antireflection film layer, a third antireflection film layer, and a fourth antireflection film layer,
the first antireflection film layer and the fourth antireflection film layer include $HfO_2$,
the second antireflection film layer includes $SiO_2$,
the third antireflection film layer includes Si, and
the first antireflection film layer, the second antireflection film layer, the third antireflection film layer, and the fourth antireflection film layer are in this order from the light-shielding wall.

7. A solid-state image sensor, comprising:
a micro lens configured to condense incident light;
a photoelectrical conversion unit configured to generate electric charge based on the condensed incident light;
a translucent plate between the micro lens and the photoelectrical conversion unit, wherein
the translucent plate includes a light-shielding wall, a first translucent part, and a second translucent part,
the first translucent part corresponds to a first pixel,
the second translucent part corresponds to a second pixel,
each of the first pixel and the second pixel is associated with the solid-state image sensor, and
the light-shielding wall is between the first translucent part and the second translucent part;
an antireflection film between the light-shielding wall and the first translucent part, wherein
the antireflection film is configured to prevent reflection of the condensed incident light having a particular wavelength, and
the antireflection film includes a first antireflection film layer and a second antireflection film layer; and
transparent insulating layer between the translucent plate and the photoelectrical conversion unit, wherein a relation of expressions below holds, and $\tan\theta_1 > \tan\theta_2$ holds:

$$\tan\theta_1 = (X+Y)/B,$$

$$\tan\theta_2 = (X-Z)/(A-B),$$

where X represents a radius of the first translucent part of the translucent plate, Y represents a radius of the micro lens, Z represents a radius of the photoelectrical conversion unit per pixel, A represents a distance between a lower end of the micro lens and the photoelectrical conversion unit, B represents a thickness of the translucent plate, and C represents a thickness of the transparent insulating layer, $\theta_1$ represents a maximum value of a first incident angle of the condensed incident light that is incident from outside a visual field of the micro lens and reflected at the light-shielding wall, and $\theta_2$ represents a minimum value of a second incident angle at which reflected light of the condensed incident light at the light-shielding wall is incident on an edge of an effective radius of the photoelectrical conversion unit.

* * * * *